US006489585B1

(12) United States Patent
Nakamura et al.

(10) Patent No.: US 6,489,585 B1
(45) Date of Patent: Dec. 3, 2002

(54) ELECTRODE FOR PLASMA GENERATION, PLASMA TREATMENT APPARATUS USING THE ELECTRODE, AND PLASMA TREATMENT WITH THE APPARATUS

(75) Inventors: Kosuke Nakamura; Yasushi Sawada, both of Neyagawa; Hiroaki Kitamura, Moriguchi; Yoshitami Inoue, Neyagawa, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/627,405

(22) Filed: Jul. 27, 2000

(30) Foreign Application Priority Data

Jul. 27, 1999 (JP) .......................................... 11-212871
Jul. 27, 1999 (JP) .......................................... 11-212872

(51) Int. Cl.[7] .............................................. B23K 10/00
(52) U.S. Cl. .......................... 219/121.52; 219/121.48; 427/488
(58) Field of Search ...................... 219/121.52, 121.47, 219/121.48, 121.36; 156/345; 204/192.38, 290.03, 298.31, 298.33; 427/488, 486, 454, 473, 567; 429/30; 118/723 E; 373/18, 23, 24

(56) References Cited

U.S. PATENT DOCUMENTS

| 4,203,810 A | * | 5/1980 | Warne et al. ................ 205/187 |
| 4,487,880 A | * | 12/1984 | Ueno et al. .................. 524/495 |
| 4,863,756 A | * | 9/1989 | Hartig et al. ................ 427/488 |
| 5,185,132 A | | 2/1993 | Horiike et al. |
| 5,372,648 A | * | 12/1994 | Yamamoto et al. ...... 118/723 E |
| 5,651,867 A | * | 7/1997 | Kokaku et al. ........ 204/298.25 |
| 6,025,094 A | * | 2/2000 | Visco et al. ........... 429/231.95 |

FOREIGN PATENT DOCUMENTS

| JP | 05 235520 | 9/1993 |
| JP | 06 002149 | 1/1994 |
| JP | 06 096718 | 4/1994 |
| JP | 7-245295 | 9/1995 |
| JP | 7-263361 | 10/1995 |
| JP | 7-297175 | 11/1995 |
| JP | 7-302786 | 11/1995 |
| JP | 7-321097 | 12/1995 |
| JP | 7-331445 | 12/1995 |
| JP | 8-96987 | 4/1996 |
| JP | 296535 | 1/1997 |
| JP | 11 191500 | 7/1999 |

* cited by examiner

Primary Examiner—Teresa Walberg
Assistant Examiner—Quang Van
(74) Attorney, Agent, or Firm—Oblon, Spivak, McClelland, Maier & Neustadt, P.C.

(57) ABSTRACT

A plasma treatment apparatus includes two or more pairs of electrodes for plasma generation, a treatment chamber for accommodating the electrodes, gas supply unit for supplying a plasma-generation gas such as rare gas into the chamber, and a power supply. A pulse-like or AC voltage is applied between the electrodes to generate dielectric barrier discharge plasma of the gas in the vicinity of atmospheric pressure, so that an object placed between the electrodes is treated by the plasma. At least one of the electrodes is provided with a tubular electrode substrate and a protection layer formed by heat-fusion coating a glass-based material on at least an outer surface exposed to plasma of the tubular electrode substrate.

19 Claims, 7 Drawing Sheets

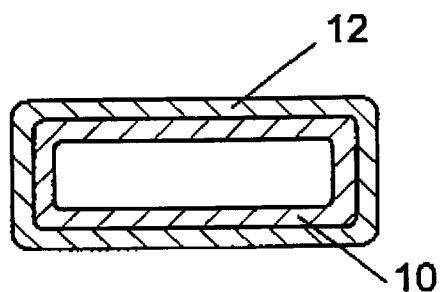
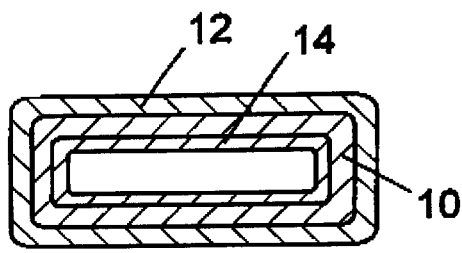
FIG. 1A  FIG. 1B
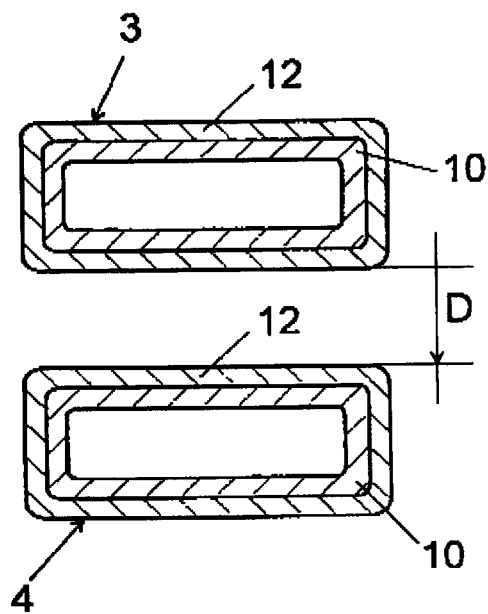
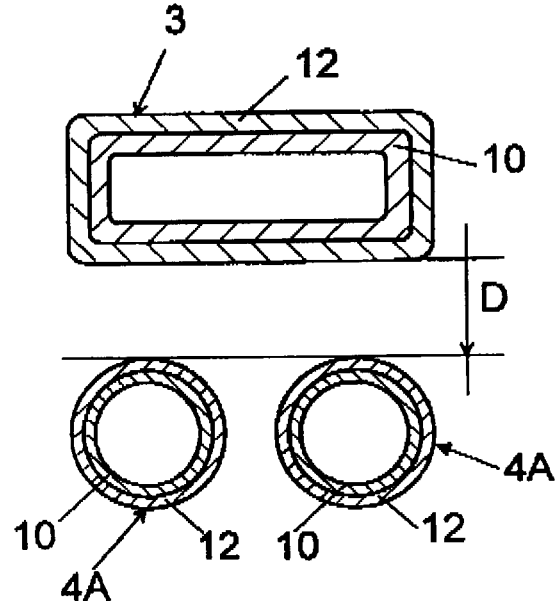
FIG. 2A  FIG. 2B

ELECTRODE FOR PLASMA GENERATION, PLASMA TREATMENT APPARATUS USING THE ELECTRODE, AND PLASMA TREATMENT WITH THE APPARATUS

BACKGROUND OF THE INVENTION

1. Field of the Invention

The present invention relates to an electrode for plasma generation having the capability of stably providing uniform plasma without unusual discharge and an increased durability of electrode, plasma treatment apparatus using the electrode, and a plasma treatment with the apparatus, which is particularly suitable for surface-cleaning glass substrates for liquid crystal display (LCD), electronic parts and so on.

2. Disclosure of the Prior Art

In the past, plasma surface treatments are performed to objects to be treated by use of plasma generated by applying an AC voltage between electrodes in a plasma-generation gas atmosphere such as argon and helium to modify or improve surface conditions of the objects. In the plasma surface treatments, it is important to prevent contamination of the objects with impurities such as spattered electrode materials, and increase the life of the electrodes exposed to plasma.

For example, Japanese Patent Early Publication [KOKAI] No. 6-96718 discloses an electrode for glow-discharge plasma generated under atmospheric pressure, which is characterized in that a plurality of metal pipes each having a ceramic-sprayed coating on its outer surface are arranged parallel with each other at a required interval between adjacent metal pipes. The ceramic-sprayed coating provides an increased electrode life and reduced contamination of the objects. However, in general, there is a problem that pinholes easily occur in the ceramic-sprayed coating.

The pinholes become a cause of poor withstand voltage of the ceramic-sprayed coating. That is, an unusual discharge such as spark discharge easily occurs in the vicinity of the pinholes. In such a case, a serious breakage of the ceramic-sprayed coating is often caused. In addition, since uniform discharge can not be stably obtained, the efficiency of plasma treatment lowers. Moreover, when some of the objects are heated at a high temperature by the unusual discharge, they may become defective pieces. Thus, the ceramic-sprayed coating still has the above problems to be improved.

On the other hand, Japanese Patent Early Publication [KOKAI] No. 11-191500 discloses an electrode for glow-discharge plasma, and a surface treatment with the glow-discharge plasma. The electrode comprises an electrode substrate and an alumina-based sintered ceramic having a purity greater than 99.6% coated on the electrode substrate. This electrode is suitable to generate stable glow discharge under atmospheric pressure. However, since the sintered ceramic is produced by means of powder metallurgy, and then is bonded to the electrode substrate by use of an adhesive, there is a problem that the adhesion between the sintered ceramic and the electrode substrate is poor.

From the viewpoints of plasma stability and durability of electrode, the electrodes for plasma generation of the past still have plenty of room for improvement.

SUMMARY OF THE INVENTION

Therefore, a primary object of the present invention is to provide an electrode for plasma generation having the capability of stably providing uniform plasma without unusual discharge, and an increased durability of electrode. That is, the electrode of the present invention comprises an electrode substrate and a protection layer formed by heat-fusion coating a glass-based material on at least a surface exposed to plasma of the electrode substrate.

It is preferred that a withstand voltage of the protection layer is within a range of 1 to 50 kV. It is also preferred that the protection layer contains silica, alumina and titania as main ingredients. Moreover, it is preferred that the protection layer contains 30 wt % or less of at least one of alkali and alkaline earth metals.

It is also preferred that the electrode substrate is of a tubular structure, and the protection layer is formed on an outer surface of the tubular structure. In this case, it is preferred that the electrode substrate has a corrosion resistance layer on an inner surface of the tubular structure. In particular, it is preferred that the electrode substrate is a seamless pipe of an electrode material, and the protection layer is formed on an outer surface of the seamless pipe, or the electrode substrate is of a tubular structure, which is formed by preparing a rectangular plate of an electrode material, and densely welding a side of the rectangular plate to the opposite side by means of voidless welding, while preventing the occurrence of voids at a welded portion.

Another object of the present invention is to provide a plasma treatment apparatus for treating an object placed in a discharge space with a dielectric barrier discharge plasma. The apparatus comprises at least one pair of electrodes for plasma generation, a treatment chamber for accommodating the electrodes therein, gas supply unit for supplying a plasma-generation gas to the discharge space defined between the electrodes, and a power supply for applying a voltage between the electrodes to generate the dielectric barrier discharge plasma of the plasma-generation gas in the discharge space. The apparatus of the present invention is characterized in that at least one of the electrodes comprises an electrode substrate and a protection layer formed by heat-fusion coating a glass-based material on at least a surface exposed to plasma of the electrode substrate.

It is preferred that the electrode is provided with the electrode substrate having a tubular structure, the protection layer on an outer surface of the tubular structure, and a corrosion resistance layer on an inner surface thereof. In addition, it is also preferred that a distance between the electrodes is within a range of 1 to 20 mm.

A further object of the present invention is to provide a plasma treatment with the plasma treatment apparatus described above. The plasma treatment is characterized in that the object is treated by the dielectric barrier discharge plasma of rare gas or a mixture of the rare gas and a reactive gas generated in the vicinity of atmospheric pressure.

These and still other objects and advantages will become apparent from the following detail description of the invention and Examples of the invention.

BRIEF EXPLANATION OF THE DRAWINGS

FIGS. 1A and 1B are cross-sectional views of electrodes for plasma generation of the present invention;

FIGS. 2A and 2B are cross-sectional views of arrangements of upper and lower electrodes of the present invention;

DETAIL DESCRIPTION OF THE INVENTION

[Electrode for Plasma Generation]

Figure 3:
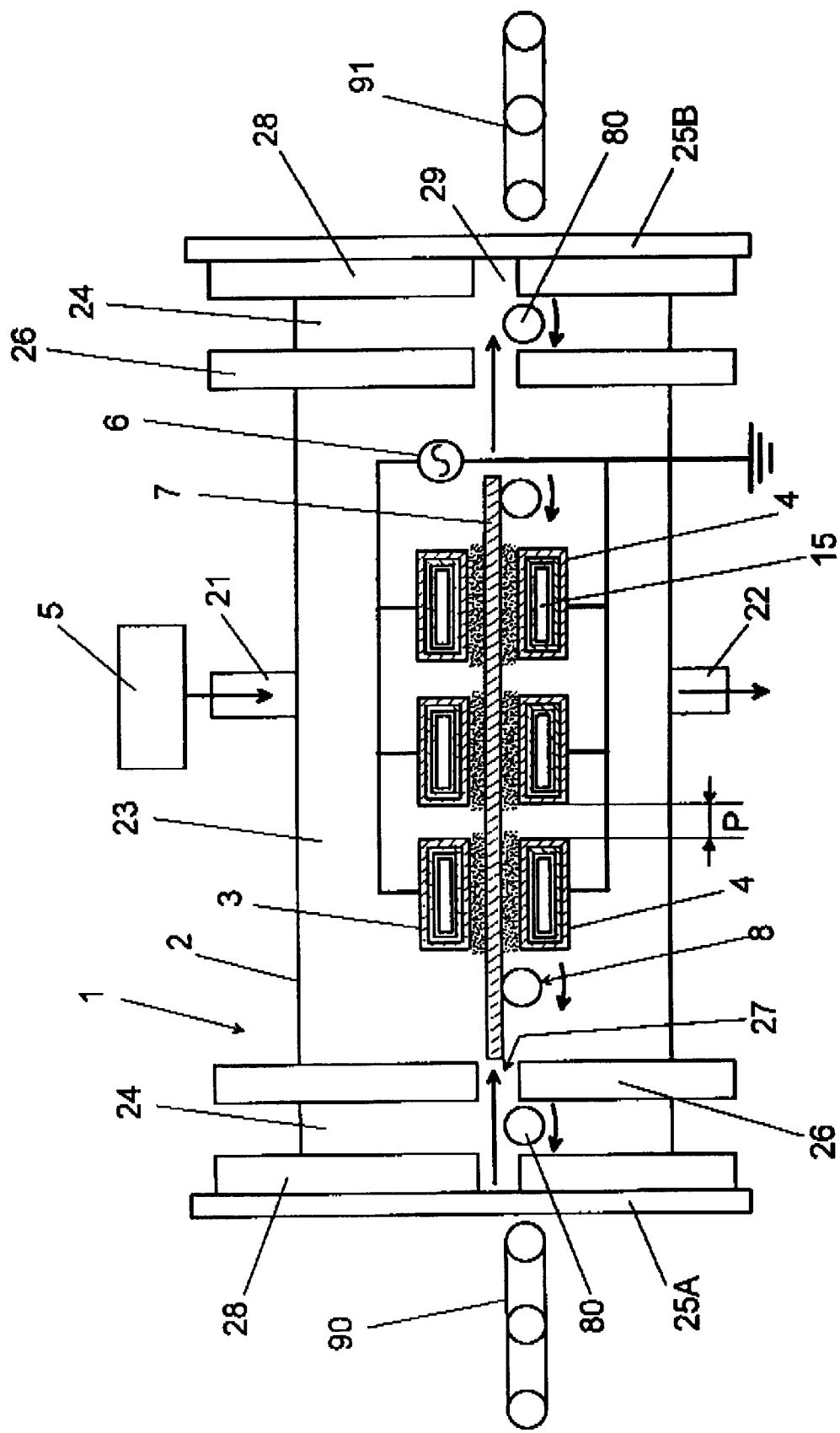
FIG. 3 is a schematic view of a plasma treatment apparatus used in Example 1 of the present invention.

First, an electrode for plasma generation of the present invention is explained in detail. As shown in FIGS. 1A and 1B, the electrode comprises an electrode substrate 10 and a protection layer 12 formed by heat-fusion coating a glass-based material on at least a surface exposed to plasma of the electrode substrate.

The electrode substrate 10 can be made of a metal material having electrical conductivity. For example, it is possible to use a conventional stainless steel, It is preferred that the electrode substrate 10 is of a tubular (pipe) structure. In this case, a coolant can be provided through the interior of the tubular structure during the plasma generation.

As the electrode substrate having the tubular structure, it is particularly preferred to use a seamless pipe. For example, the seamless pipe can be produced by means of extrusion. In general, the tubular electrode can be produced by welding one or more metal sheets. However, small voids easily occur at welded joints of the tubular electrode produced by the conventional welding. For example, when a protection film is formed on the electrode having the voids at the welded joints, and the electrode is used for a plasma treatment apparatus, there is a possibility that a trapped gas in the voids is volume-expanded by heat generated during the plasma generation, and the protection layer receives a serious damage by a jet of the trapped gas issuing from the voids. Therefore, using the seamless pipe as the electrode substrate is particularly preferred to avoid the occurrence of accidental breakage of the protection layer.

Alternatively, it is preferred to use a tubular electrode substrate produced by preparing a rectangular plate of an electrode material, and densely welding a side of the rectangular plate to the opposite side by means of voidless welding, e.g., radio-frequency (resistance) welding, while preventing the occurrence of voids at the welded joint.

When using an electrode substrate having a rectangular tubular (pipe) structure, it is preferred that the electrode substrate has rounded corners to enhance the uniformity of plasma, as shown in FIGS. 1A and 1B. For example, the rounded corner may have a radius of curvature of about 1 to 10 mm.

The protection layer 12 is formed by heat-fusion coating a glass-based material on the surface of the electrode substrate. For example, as the glass-based material, it is possible to use a mixture of inorganic powders such as silica, alumina, tin oxide, titania and zirconia. In particular, it is preferred that the glass-based material includes silica, alumina and titania as main ingredients.

In particular, it is preferred that the protection layer contains 30 wt % or less, and more preferably 2 to 20 wt % of at least one of alkali metals such as Na and K, and/or at least one of alkaline earth metals such as Mg and Ca. When the content of the alkali/alkaline earth metal is more than 30 wt %, the withstand voltage of the protection layer may reduce. When the content of the alkali/alkaline earth metal is within the range of 2 to 20 wt %, it is possible to further improve adhesion between the electrode substrate and the protection layer, and the durability of the protection layer. In addition, to improve the adhesion between the protection layer and the electrode substrate, the glass-based material may comprise cobalt oxide (CoO), nickel oxide (NiO), or manganese dioxide ($MnO_2$).

Concretely, the protection layer can be formed by the heat-fusion coating comprising the following steps. That is, a mixture of the inorganic powders described above and a solvent such as water is used as the glass-based material. For example, the inorganic powder and the alkali/alkaline earth metal, if necessary, are mixed with the solvent, and then the resultant mixture is milled to obtain the glass-based material. The glass-based material is applied to the surface exposed to plasma of the electrode substrate. For example, this applying step can be performed by spraying the glass-based material on the electrode substrate with use of a spray gun, or dipping the electrode substrate in a bath filled with the glass-based material. To stably obtain an applied film of good quality on the electrode substrate, it is preferred to use a slurry prepared by milling the mixture for a required time period, and then allowing the milled mixture to pass a 200 mesh sieve (aperture size: 74 $\mu$m) or a 325 mesh sieve (aperture size: 44 $\mu$m). When the electrode substrate is of the tubular structure, it is preferred to apply the glass-based material on the entire outer surface of the tubular structure.

If necessary, it is preferred that a surface roughing treatment is performed to the surface of the electrode substrate before the applying step to improve adhesion between the electrode substrate and the protection layer. For example, the roughing treatment can be performed by use of an air blast including glass beads or sand.

Next, the applied film of the glass-based material is heated at a temperature of 400 to 1000° C. for about 1 to 15 minutes. A thick protection layer can be readily obtained by repeating the above-described applying and heating steps a given number of times.

The protection layer 12 produced by the heat-fusion coating has some advantages as compared with that prepared by means of a conventional ceramic spraying. That is, pinholes easily occur in the ceramic-sprayed layer, as described before. On the contrary, when producing the protection layer by the heat-fusion coating, it is possible to remarkably reduce the frequency of occurrence of pinholes. In addition, there is an advantage that the cost of producing the protection layer by the heat-fusion coating is smaller than that of producing the ceramic sprayed layer.

In the present invention, it is preferred that the withstand voltage of the protection layer is within a range of 1 to 50 kV. When the withstand voltage is less than 1 kV, it becomes a cause of the occurrence of cracks or peeling of the protection layer. When the withstand voltage is more than 50 kV, the protection layer needs a larger thickness, so that the durability of the protection layer may decrease. In such a case, it becomes difficult to provide uniform dielectric barrier discharge plasma. In the present specification, the dielectric barrier discharge plasma is defined as plasma generated between electrodes, at least one of which has a dielectric layer, i.e., protection layer on the surface exposed to the plasma of the electrode substrate. The withstand voltage of the above range of the protection layer can be achieved by controlling the thickness and the composition of the protection layer. For example, it is preferred that a thickness of the protection layer is within a range of 0.01 to 2 mm.

By the way, when the electrode substrate having the tubular structure is heated at the high temperature during the heat-fusion coating, undesired oxides (rust) may occurs on the inner surface of the electrode substrate. For example, when a coolant is circulated through the tubular electrodes having the undesired oxides by use of an electrode cooling unit during the plasma generation, there is a possibility that clogging of the electrode cooling unit or a coolant pump is caused by contamination of the coolant with flakes of the undesired oxides from the inner surface of the electrode substrate. In addition, the durability of the electrode may reduce. The reduction in durability of the electrode becomes a cause of the generation of unstable plasma.

To avoid these phenomenons, it is preferred to previously remove the undesired oxides from the electrode substrate with an acid such as nitric acid or sulfuric acid. In particular, as shown in FIG. 1B, it is preferred to form a corrosion resistance layer 14 on the entire inner surface of the electrode substrate 10 after the heat-fusion coating. Concretely, the corrosion resistance layer can be formed by a chromate treatment.

Additionally, it is preferred to perform surface polishing to improve a flatness of the protection layer. The surface polishing is useful to reduce variations in electrostatic capacity of the protection layer.

In conclusion, the electrode for plasma generation of the present invention can provide the following advantages.

1. Since the frequency of occurrence of pinholes is remarkably reduced by producing the protection layer by the heat-fusion coating, it is possible to stably provide uniform dielectric barrier discharge plasma, while preventing the occurrence of unusual discharge such as spark discharge and streamer discharge.
2. There is no need to worry about erosion of the electrode substrate by plasma and contamination of objects to be treated with spattered electrode materials over an extended time period.
3. Even when the protection layer having a large thickness up to 2 mm is formed on the electrode substrate, excellent adhesion between the electrode substrate and the protection layer is stably obtained. This provides a high degree of reliability of the electrode for plasma generation and an extended electrode life.
4. When the protection layer contains 30 wt % or less, and more preferably 2 to 20 wt % of at least one of alkali and alkaline earth metals, it is possible to further improve the adhesion between the electrode substrate and the protection layer, and the durability of the protection layer.
5. When the electrode for plasma generation, which is composed of the electrode substrate of the seamless pipe and the protection layer on the outer surface of the seamless pipe, is used in a plasma treatment apparatus for treating objects with the dielectric barrier discharge plasma of a plasma-generation gas generated in the vicinity of atmospheric pressure, it is possible to stably provide a high plasma-treatment efficiency for an extended time period, while minimizing the occurrence of accidental breakage of the protection layer.

[Plasma Treatment Apparatus]

Next, a plasma treatment apparatus with the electrodes for plasma generation of the present invention is explained in detail. The plasma treatment apparatus treats an object placed in a discharge space between the electrodes with dielectric barrier discharge plasma. That is, as shown in FIGS. 3 to 8, the apparatus 1 has a treatment chamber 2 having a gas inlet 21 for a plasma-generation gas and a gas outlet 22 for spent gas, at least one pair of upper and lower electrodes (3, 4, 4A) for plasma generation, gas supply unit 5 for supplying the plasma-generation gas into the chamber, and a power supply 6 for applying a voltage between the upper and lower electrodes to generate the dielectric barrier discharge plasma of the plasma-generation gas in the discharge space.

Figure 4:
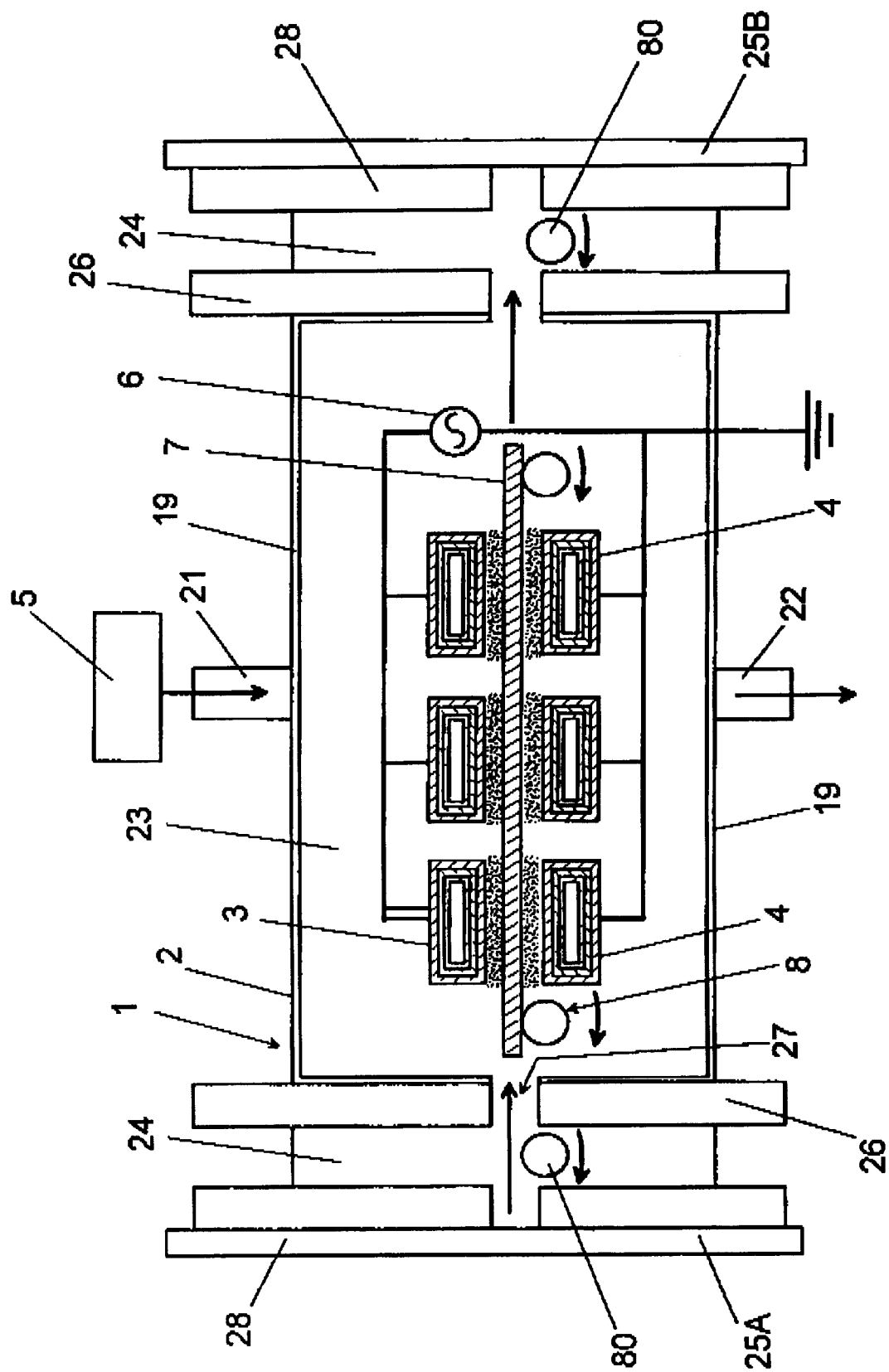
FIG. 4 is a schematic view of a modification of the plasma treatment apparatus of Example 1.

The treatment chamber 2 can be made of a synthetic resin such as acrylic resins or a metal material such as stainless steels. To prevent the power loss, improve the discharge efficiency, and stably provide uniform plasma, it is preferred that an insulation layer 19 is formed on the entire inner surface of the chamber 2, as shown in FIG. 4. For example, as a material for the insulation layer, it is possible to use a dielectric compound such as quartz, yttrium partially-stabilized zirconia (Y-PSZ), titania (TiO2), silica (SiO2), alumina (Al2O3), aluminum nitride (ALN), silicon carbide (SiC), diamond-like carbon (DLC), barium titanate, lead zirconate titanate (PZT), a resin material such as Teflon®, or a glass-based material that can be used to produce the protection layer of the present invention. The insulation layer may be formed on the outer surface of the chamber 2.

For example, the insulation layer can be formed by plasma-spraying an inorganic powder such as alumina, barium titanate, tin oxide, PZT or a mixture thereof, to the inner surface of the chamber 2, or dipping the chamber in a bath filled with molten Teflon®. Alternatively, it is possible to use the heat-fusion coating of the present invention. As an example, a mixture prepared by dispersing the inorganic powders of silica, tin oxide, titania, zirconia and alumina in a solvent is sprayed on the inner surface of the chamber, Then, the sprayed film is heated at 600° C. or more to obtain the insulation layer. Moreover, the insulation layer can be formed by means of chemical vapor deposition (CVD) or physical vapor deposition (PVD).

Figure 5:
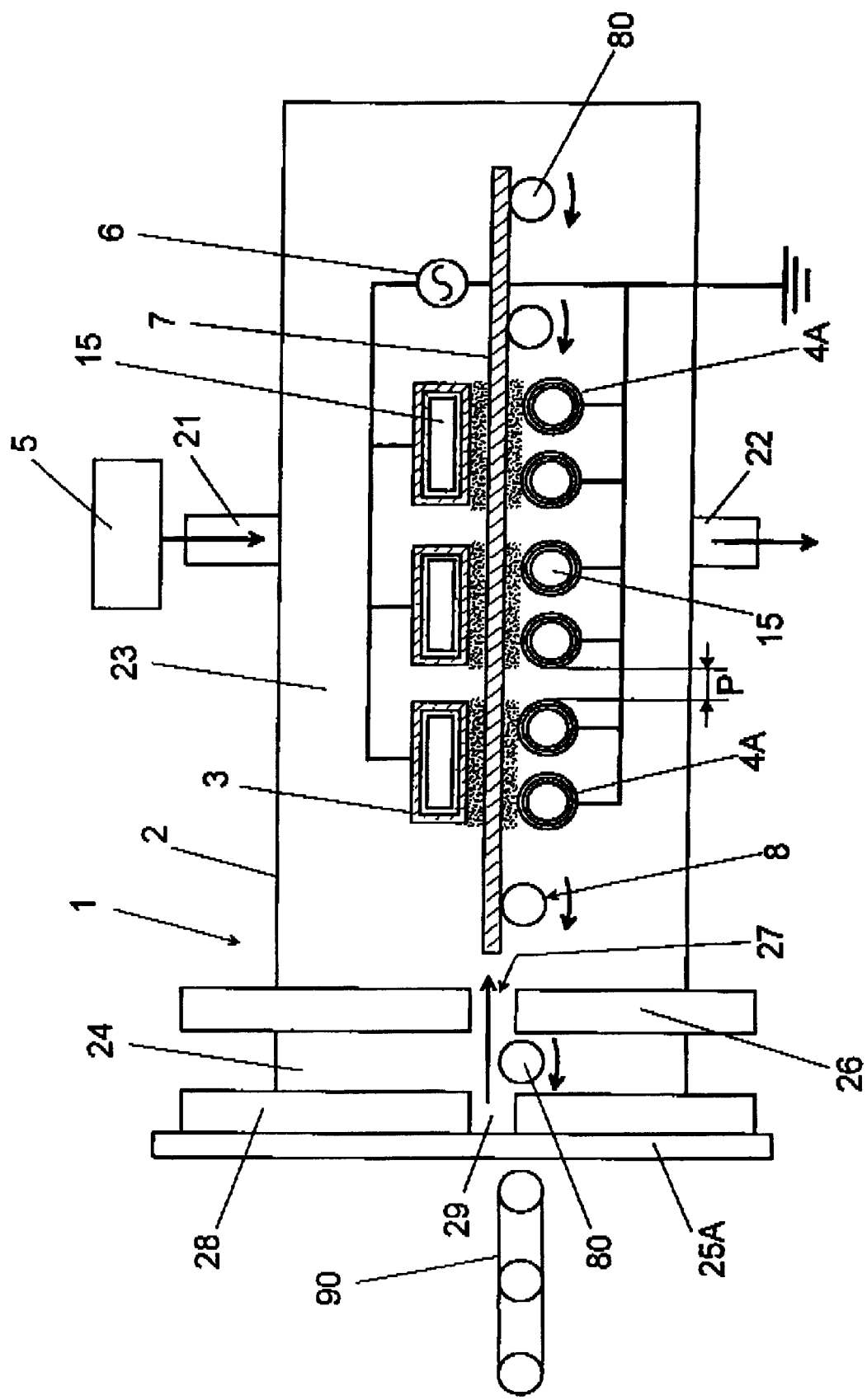
FIG. 5 is a schematic view of a plasma treatment apparatus used in Example 2 of the present invention.
Figure 6:
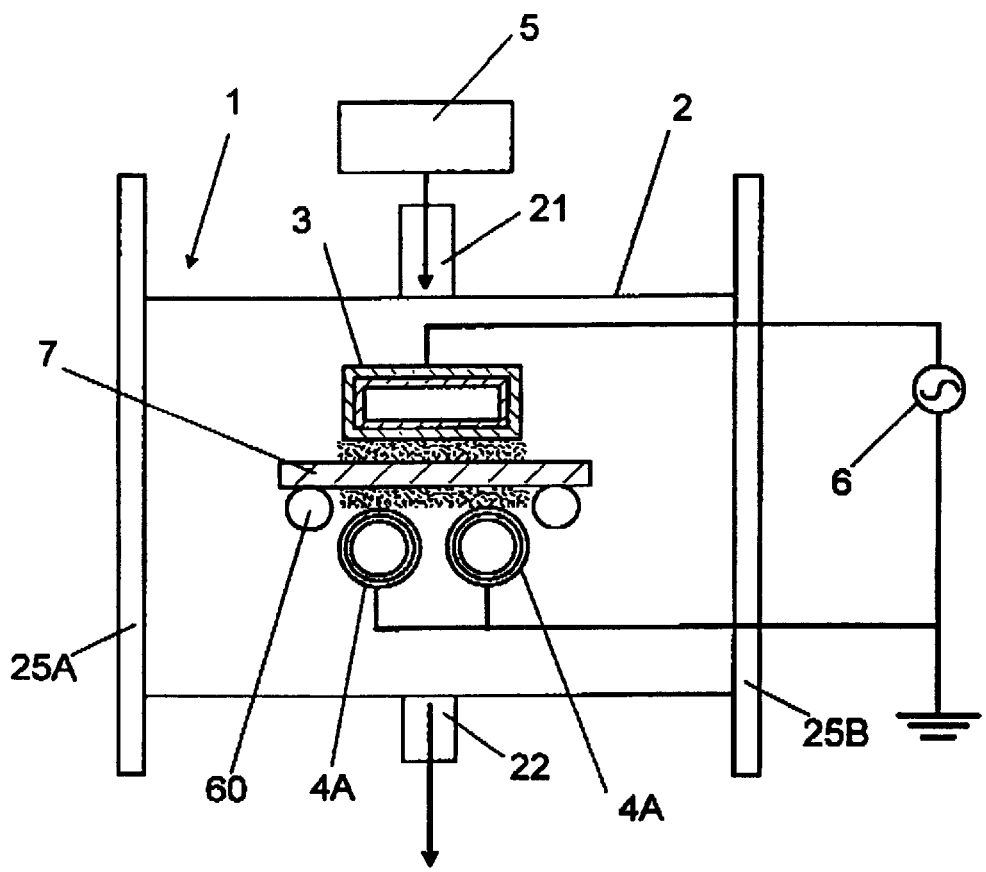
FIG. 6 is a schematic view of a plasma treatment apparatus used in Examples 3 and 4 of the present invention.

The upper and lower electrodes (3, 4) are accommodated in the chamber 2. For example, as shown in FIGS. 2A and 3, three electrode pairs, each of which is composed of upper and lower electrodes (3, 4) each having a rectangular pipe structure, can be arranged parallel with each other such that each of the electrode pairs is spaced from the adjacent electrode pair by a required interval. Alternatively, as shown in FIGS. 2B and 5, three electrode sets, each of which is composed of a single upper electrode 3 having the rectangular pipe structure and two lower electrodes 4A each having a cylindrical structure, can be arranged parallel with each other such that each of the electrode sets is spaced from the adjacent electrode set by a required interval. Of course, as shown in FIG. 6, only one set of the single upper electrode 3 and two lower electrodes 4A may be disposed in the chamber 2. In place of the above electrode arrangements, it is also preferred to use at least one electrode pair, which is composed of upper and lower electrodes each having a cylindrical structure. The upper electrode is arranged parallel with the lower electrode through a required distance. Each of the upper and lower electrodes (3, 4, 4A) can be supported by use of an electrode holder (not shown) in the chamber 2.

As shown in FIGS. 2A and 2B, it is preferred that a distance (D) between the upper electrode 3 and the lower electrode (4, 4A) is within a range of 1 to 20 mm, and more preferably 3 to 5 mm. When the distance (D) is less than 1 mm, there is a possibility that a short circuit happens. When the distance (D) is more than 20 mm, it may become difficult to stably provide uniform plasma.

The gas supply unit 5 controls a flow amount of the plasma-generation gas. The power supply 6 provides an AC or pulse-like voltage between the upper and lower electrodes. Concretely, it is preferred that a frequency of the AC or pulse-like voltage is within a range of 1 kHz to 200 MHz according to reasons described later.

When the electrodes are of the tubular structure, it is preferred that the plasma treatment apparatus 1 comprises the electrode cooling unit for circulating a coolant 15 through the tubular electrodes to maintain the electrode temperature constant during the plasma generation. When the dielectric barrier discharge plasma is generated by applying the AC or pulse-like voltage having a high frequency between the upper and lower electrodes (3, 4 or 4A) in the vicinity of atmospheric pressure, the electrode temperature may excessively increase, so that streamer discharge (arc discharge) easily occurs between the electrode and the object 7. The occurrence of streamer discharge becomes a cause of thermal damage of the object. Therefore, in such a case, the electrode cooling unit is effective to stably provide the plasma treatment without the streamer discharge.

As the coolant 15, it is possible to use ion-exchange water or pure water. In addition, it is preferred that the coolant is a liquid having antifreeze property at 0° C. as well as electrical insulation. As to the electrical insulation, it is preferred that the coolant has a withstand voltage of at least 10 kV under 0.1 mm interval. The coolant having the electrical insulation of the above range is suitable to prevent the occurrence of a leakage current when a high voltage is applied between the upper and lower electrodes. As such a coolant, for example, it is possible to use perfluorocarbon, hydrofluoro ether or a mixture obtained by adding 5 to 60 wt % of ethylene glycol to pure water.

In addition, it is preferred that the plasma treatment apparatus comprises a conveying unit 8 for feeding an object 7 to be treated into the discharge space between the upper and lower electrodes (3, 4 or 4A) and removing a plasma-treated object from the discharge space. For example, as shown in FIG. 3, a plurality of rollers 80 are arranged at a space other than the discharge space in the chamber. It is preferred that each of the rollers 80 is made of a synthetic resin having excellent heat resistance such as Teflon®. The rollers can be rotated by a drive unit (not shown) to feed the object 7 in a direction shown by the arrows in FIG. 3. In FIG. 1, the numerals 90, 91 designate belt conveyers disposed at the incoming and outgoing sides of the chamber 2, respectively.

Figure 8:
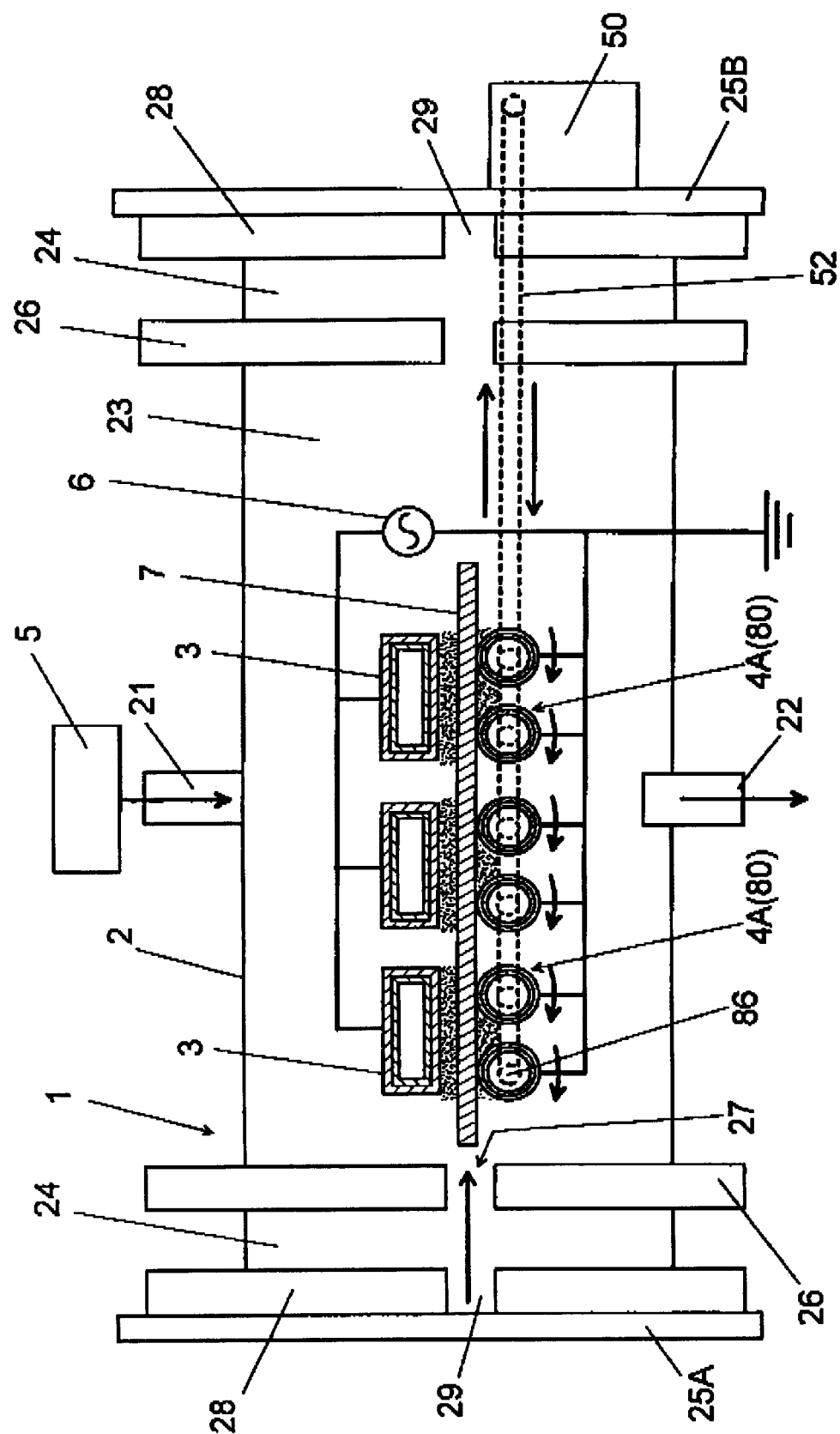
FIG. 8 is a schematic view of a plasma treatment apparatus used in Example 6 of the present invention.

As shown in FIG. 8, it is preferred to use the lower electrodes 4A having the cylindrical structure as rollers 80 for conveying the object 7. That is, each of the lower electrodes 4A is rotatably supported about its axis in the chamber 2, and can be rotated by a drive unit 50 through a power transfer belt 52 such as a rubber belt. Therefore, the lower electrodes 4A act as the rollers 80 as well as the electrodes for plasma-generation.

Figure 9:
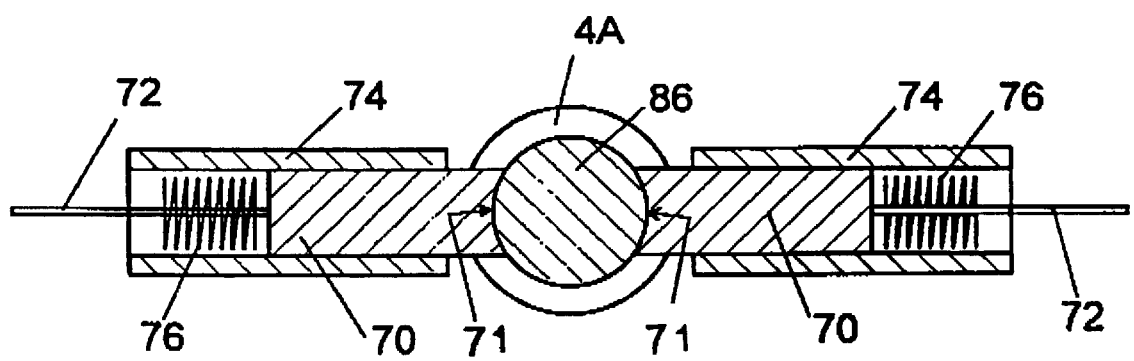
FIG. 9 is a cross-sectional view of an indirect connection mechanism between an electric wire and a rotatable electrode.

By the way, since each of the lower electrodes 4A is rotated about its axis, an electric wire can not be directly connected to the lower electrode. Therefore, as shown in FIG. 9, it is preferred to use an indirect connection mechanism described below. That is, a brush 70 contacts a side surface of a round bar 86 projecting on one end of the lower electrode 4A. The brush 70 has a concave end 71 having a radius of curvature, which is substantially the same as the radius of the round bar 86. Therefore, the concave end 71 of the brush slidably fits the side surface of the round bar 86. The brush 70 is slidably supported in a guide cylinder 74. In addition, a spring 76 is disposed in the guide cylinder 74 such that a spring bias is given to the brush 70 in a direction of pressing the brush against the round bar 86. Therefore, the brush 70 always contacts the round bar 86 during the rotation of the lower electrode 4A. Thus, the electric wire 72 is connected to the lower electrode 4A through the round bar 86 and the brush 70. In this case, it is possible to reduce the dimensions of the chamber 2 by minimizing the number of the rollers 80 of the conveying unit 8.

For example, as shown in FIGS. 3 to 5, it is preferred that the chamber 2 has a treatment room 23, in which the electrodes (3, 4, 4A) are arranged, and the object 7 is treated with the dielectric barrier discharge plasma, and at least one relaxation room 24 disposed adjacent to the treatment room. The relaxation room 24 is suitable to prevent the entry of the outside air into the treatment room 23 and a leakage of the plasma-generation gas from the chamber 2 to the outside.

Figure 7:
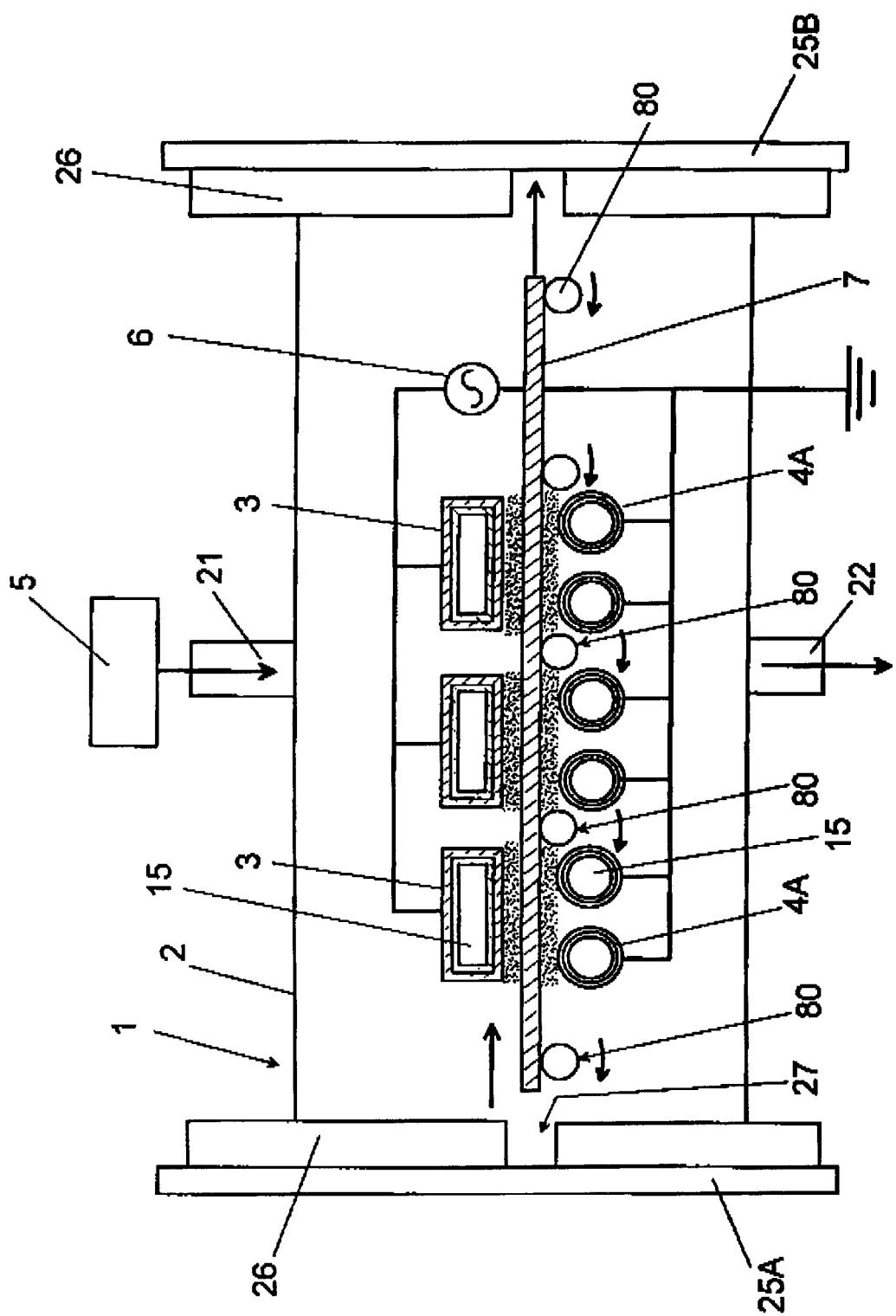
FIG. 7 is a schematic view of a plasma treatment apparatus used in Example 5 of the present invention.

It is also preferred that incoming and outgoing gates 25A, 25B are disposed at the opposite sides of the chamber 2, as shown in FIG. 3 or 7. In this case, the plasma treatment apparatus 1 becomes an inline-type structure. Of course, a single gate 25A can be disposed at one side of the chamber 2, as shown in FIG. 5. In this case, the plasma treatment apparatus 1 becomes a shuttle-type structure. As the gate (25A, 25B), it is possible to use a conventional shutter that can be moved up or down by use of air or oil pressure.

In addition, when using a sensor for detecting the approach of the object 7 to the gate (25A, 25B), the gate can be automatically opened and closed according to a signal detected by the sensor. Therefore, the sensor is useful to realize an automated plasma-treatment line.

[Plasma Treatment]

Next, a plasma treatment with the above-described apparatus of the present invention is explained in detail. In the plasma treatment, it is preferred that the object 7 is treated by the dielectric barrier discharge plasma of the plasma-generation gas generated between the upper and lower electrodes (3, 4 or 4A) in the vicinity of atmospheric pressure.

The plasma-generation gas comprises rare gas and a mixture of the rare gas and a reactive gas. Concretely, as the rare gas, it is possible to use helium, argon, neon and krypton, and more preferably helium, argon or a mixture thereof. As the reactive gas, for example, it is possible to use an oxidation gas such as oxygen, air, $CO_2$, water vapor or $N_2O$, fluorine-contained gas such as $CF_4$, and a reduction gas such as hydrogen and ammonium. When cleaning organic compounds on the object 7, removing resists, etching an organic film, or surface-cleaning glass plates for LCD (liquid crystal display), it is preferred to use plasma including the oxidation gas. When etching silicon wafer or cleaning a surface to be soldered, it is preferred to use the plasma including the fluorine-contained gas. In addition, when reducing metal oxides, it is preferred to use the plasma including the reduction gas.

When using a mixture of the rare gas and the reactive gas, it is preferred that an additive amount of the reactive gas is 10 wt % or less and more preferably within a range of 0.1 to 5 wt %, with regard to the amount of the rare gas. When the additive amount of the reactive gas is less than 0.1 wt %, the plasma-treatment effect may be insufficient. On the other hand, when the additive amount is more than 10 wt %, the dielectric barrier discharge plasma generated under atmospheric pressure may become unstable. As the vicinity of atmospheric pressure, it is preferred to select a pressure within a range of 700 to 800 Torr, i.e., about 93 to 107 kPa. In this range, it is easy to control the plasma.

As described before; it is preferred that the frequency of the AC or pulse-like voltage is within the range of 1 kHz to 200 MHz. When the frequency is less than 1 kHz, it may become difficult to stably maintain the atmospheric pressure plasma during the plasma treatment.

On the other hand, when the frequency is more than 200 MHz, the temperature of the atmospheric-pressure plasma increases, so that the electrode life may decrease. In addition, it may become difficult to provide uniform plasma treatment.

Advantages of the plasma-treatment apparatus and effects of the plasma treatment of the present invention will be understood more clearly according to the following Examples.

EXAMPLE 1

A plasma treatment apparatus 1 of the present invention used in Example 1 is shown in FIG. 3. The apparatus 1 comprises a treatment chamber 2 having a gas inlet 21 for a plasma-generation gas and a gas outlet 22 for spent gas, three pairs of upper and lower electrodes (3, 4) accommodated in the chamber, gas supply unit 5 for supplying the plasma-generation gas into the chamber, and an power supply 6. The chamber 2 is made of a stainless steel (JIS (Japanese Industrial Standard): SUS 304) and has dimensions of 860 mm width×116 mm height×800 mm length.

Each of the upper and lower electrodes 3, 4 is provided with an electrode substrate 10, which is of a rectangular pipe structure having the dimensions of 32 mm width×16 mm height×911 mm length, protection layer 12 on an outer surface of the electrode substrate, and a corrosion resistance layer 14 on an inner surface of the electrode substrate, as shown in FIG. 1B.

As shown in Table 1, the electrode substrate 10 was produced by preparing a rectangular plate of a stainless steel (JIS: SUS 304) having a thickness of 1.5 mm, and densely welding a side of the rectangular plate to the opposite side by means of radio-frequency welding, while preventing the occurrence of remaining voids at the welded joint. A radius of curvature of the respective corner portion of the electrode substrate 10 is about 1.5 mm.

After a surface-roughing treatment was performed to the outer surface of the electrode substrate 10 by use of an air blast containing glass beads with a required particle size, the protection layer 12 was formed on the outer surface of the electrode substrate by repeating a heat-fusion coating explained below three times. That is, the heat-fusion coating comprises the steps of applying about 300 to 500 g of a glass-based material on the outer surface of the electrode substrate by use of a spray gun to obtain an applied film, drying the applied film at about 100° C., and heating the applied film at about 850° C. for 10 minutes.

The glass-based material for the spray coating was prepared by the following steps. A frit including alumina, silica and titania as main ingredients was prepared by melting and then rapid cooling these inorganic powders. A mixture was obtained by adding sodium aluminate and potassium carbonate to the frit in the presence of water as a solvent. After the mixture was milled for a required time period, it was allowed to pass a 200 mesh sieve (aperture size: 74 μm) to obtain a slurry as the glass-based material. As a result, the protection layer 12 having the thickness of about 0.5 mm and the withstand voltage of 20 kV was obtained on the electrode substrate 10. The composition of the protection layer 12 is shown in Table 1.

After the protection layer 12 was produced, a by-product (rust) that occurs on the inner surface of the electrode substrate 10 during the heat-fusion coating was removed by keeping the electrode substrate in an acid cleaning fluid for 180 minutes to obtain a fresh inner surface thereof. Next, a chromate treatment was performed by keeping the electrode substrate in a chromate solution for 120 minutes, to obtain the corrosion resistance layer 14 on the fresh inner surface of the electrode substrate 10.

The upper and lower electrodes 3, 4 produced by the above procedure are arranged parallel with each other in the chamber 2, as shown in FIG. 3, such that the distance (D) between the upper and lower electrodes 3, 4 of each electrode pair is 3 mm, and a pitch (P) between adjacent electrode pairs is 40 mm.

The treatment chamber 2 has a plasma-treatment room 23, in which an object 7 is treated with dielectric barrier discharge plasma, and two relaxation rooms 24 at the both sides of the treatment room for preventing the entry of the outside air into the plasma-treatment room and a leakage of the plasma-generation gas from the chamber to the outside. The plasma-treatment room 23 is isolated from each of the relaxation rooms 24 by an inner side-wall 26 having a slit 27 used to feed the object 7 into the treatment room 23. The relaxation rooms 24 are respectively isolated from the outside by the incoming and outgoing gates 25A, 25B each having an air-pressure open/close mechanism through an outer side-wall 28 having a slit 29 used to feed the object 7 into the relaxation room 24. Thus, the apparatus 1 of Example 1 has an inline-type structure that the object is fed from the incoming gate 25A into the chamber 2, and a plasma-treated object is removed from the chamber through the outgoing gate 25B.

The plasma treatment apparatus 1 also comprises a conveying unit 8 for feeding the object 7 into the treatment room 23 and removing the plasma-treated object from the treatment room through the outgoing gate 25B. Concretely, the conveying unit 8 has a plurality of rollers 80 and a drive unit (not shown) for rotating the rollers. In addition, the apparatus 1 has an electrode cooling unit for circulating a coolant 15 through the respective electrodes.

By use of the above apparatus 1 of Example 1, the following plasma treatment was performed, As the object 7 to be treated, a glass plate for liquid crystal display (LCD) was used, which has the dimensions of 750 mm×600 mm×0.7 mm. As the plasma-generation gas, helium was supplied with a flow amount of 8 liter/min into the chamber 2 through the gas inlet 21. Ion exchange water of the coolant 15 was circulated through the electrodes 3, 4 during the plasma treatment. The temperature of ion exchange water was maintained at about 20° C. by the electrode cooling unit.

All of the lower electrodes 4 are grounded, and all of the upper electrodes 3 are connected to the power supply 6. 2 kV of AC voltage was applied between the upper and lower electrodes 3, 4 to generate the dielectric barrier discharge plasma of helium therebetween under atmospheric pressure. The applied electric power is 1600 W. A frequency of the AC voltage is 100 kHz.

The glass plate of the object 7 was conveyed in front of the incoming gate 25A by a first belt conveyer 90. Then, the incoming gate 25A was opened to feed the glass plate 7 into the chamber 2. After the entry of the glass plate into the chamber was finished, the incoming gate 25A was closed. The glass plate was treated with the plasma, while being fed at a speed of 200 mm/sec by the conveying unit 8.

After the plasma treatment was finished, the plasma-treated object was fed to the relaxation room 24 adjacent to the outgoing gate 25B. The outgoing gate 25B was opened, and then the plasma-treated object was removed from the chamber 2 by a second belt conveyer 91. Since a mirror reflective-type sensor detects the approach of the object 7 to the gate (25A, 25B), the gate can be automatically opened and closed according to a signal detected by the sensor.

To evaluate an effect of the plasma treatment, a contact angle of water with the glass plate was measured before and after the plasma treatment. That is, the contact angle of water with the untreated glass plate is 45 degrees. On the other hand, the contact angle of water with the plasma-treated glass plate is 5 degrees. Thus, the contact angle of water can be remarkably reduced by the plasma treatment. In addition, variations in contact angle of water with the plasma-treated glass plate narrow to a range of 5 degrees ±4 degrees.

Even after the plasma treatment was continuously performed for about six months, the plasma treatment apparatus 1 could stably provide uniform plasma without the occurrence of unusual discharge and a serious damage of the protection layer. In addition, there was no contamination of the plasma-treated glass plate during the six months of the plasma treatment. Moreover, since each of the upper and lower electrodes 3, 4 has the corrosion resistance layer 14, there was no contamination of ion exchange water even after the elapse of the six months of the plasma treatment. When the distance (D) between the upper and lower electrodes 3, 4 of each electrode pair is 5 mm, similar results were obtained, Details of the electrodes 3, 4 used in Example 1 and conditions of the above plasma treatment are shown in Tables 1 and 2.

In an additional experiment of Example 1, as shown in FIG. 4, an insulation layer 19 was formed on the entire inner surface of the chamber 2 by the following method. That is, a glass-based material, which is the same as one used to produce the protection layer 12 of the electrodes 3, 4 was sprayed on the entire inner surface of the chamber. Then, the sprayed film was heated at about 850° C. for 10 minutes to obtain the insulation layer 19. The thickness and withstand voltage of the insulation layer 19 are about 0.1 mm and about 2 kV, respectively. In this experiment, the distance (D) between the upper and lower electrodes 3, 4 is 10 mm, and a distance between the lower electrode 4 and the insulation layer 19 on an inner bottom surface of the chamber 2 of FIG. 4 is 10 mm. On the other hand, a distance between the lower electrode 4 and an inner bottom surface having no insulation layer of the chamber 2 of FIG. 3 is 40 mm.

The plasma treatment was performed under the same conditions as the above. No unusual discharge occurred during the experiment even though the distance between the lower electrode 4 and the inner bottom surface of the chamber 2 is reduced. Thus, the formation of the insulation layer 19 is useful to minimize the dimensions of the chamber, while preventing the occurrence of the unusual discharge.

EXAMPLE 2

A plasma treatment apparatus 1 of the present invention of Example 2 is shown in FIG. 5. The apparatus 1 of FIG. 5 is substantially the same as that of FIG. 3 except for the following features. Details of electrodes 3, 4A and conditions of the plasma treatment of Example 2 are shown in Tables 1 and 2.

The apparatus 1 of Example 2 is characterized in that three electrode sets, each of which is composed of a single upper electrode 3 having a rectangular pipe structure and two lower electrodes 4A each having a cylindrical structure, are arranged parallel with each other such that a distance (D) between the upper and lower electrodes is 3 mm, as shown in FIG. 2B. Each of the upper and lower electrodes 3, 4A is formed with an electrode substrate 10, which is a seamless pipe of a stainless steel (JIS: SUS304) produced by extrusion, and a protection layer 12 on an outer surface of the seamless pipe 10. After a surface roughing treatment was performed to the outer surface of the seamless pipe by use of an air blast containing glass beads, the protection layer 12 was formed under the same conditions of the heat-fusion coating as Example 1 except that the glass-based material for the spray coating was prepared by the following steps.

A frit including alumina, silica and titania as main ingredients was prepared by melting and then rapid cooling these inorganic powders. A mixture was obtained by adding sodium aluminate, potassium carbonate and magnesium carbonate to the frit in the presence of water as a solvent. After the mixture was milled for a required time period, it was allowed to pass a 325 mesh sieve (aperture size: 44 $\mu$m) to obtain a slurry as the glass-based material. As a result, the protection layer 12 has the thickness of about 1 mm and the withstand voltage of 50 kV. The composition of the protection layer 12 is shown in Table 1. After the protection layer was formed, a by-product (rust) that occurs on the inner surface of the seamless pipe by the heat-fusion coating was removed by keeping the seamless pipe in an acid cleaning fluid for 120 minutes to obtain a fresh inner surface of seamless pipe.

The three electrode sets of the electrodes 3, 4A produced by the above procedure are arranged parallel with each other in the chamber 2, as shown in FIG. 5, such that a pitch (P) between adjacent electrode sets is 40 mm.

By use of the apparatus 1 of FIG. 5, the following plasma treatment was performed. In Example 2, a glass plate for LCD having the dimensions of 750 mm×600 mm×0.7 mm was used as an object to be treated. A mixture gas of helium and oxygen was supplied as the plasma-generation gas into the chamber 2 through the gas inlet 21. A flow amount of helium is 8 liter/min. A flow amount of oxygen is 100 cc/min. Ion exchange water of the coolant 15 maintained at about 20° C. was circulated through the respective electrodes during the plasma treatment.

All of the lower electrodes 4A are grounded, and all of the upper electrodes 3 are connected to the power supply 6. 2 kV of AC voltage was applied between the upper and lower electrodes to generate the dielectric barrier discharge plasma of the mixture gas in a discharge space therebetween under atmospheric pressure. The applied electric power is 1600 W. A frequency of the AC voltage is 100 kHz.

The glass plate was conveyed in front of a gate 25A by a belt conveyer 90. Then, the gate 25A was opened to feed the glass plate 7 into the chamber 2. After the entry of the glass plate into the chamber was finished, the gate 25A was closed. The glass plate was treated with the plasma, while being fed at a speed of 74 mm/sec by the conveying unit 8. After the plasma treatment was finished, the plasma-treated object was conveyed toward the gate 25A from the treatment room 23. Then, the gate 25A was opened again, and the plasma-treated object was removed from the chamber 2 by the belt conveyer 90. Thus, the plasma treatment apparatus 1 of Example 2 has a shuttle type structure that the object 7 is conveyed from the gate 25A into the chamber 2 and the plasma-treated object is removed from the chamber through the same gate.

To evaluate an effect of the plasma treatment, a contact angle of water with the glass plate was measured before and after the plasma treatment. That is, the contact angle of water with the untreated glass plate is 45 degrees. On the other hand, the contact angle of water with the plasma-treated glass plate is 7 degrees. Thus, the contact angle of water can be remarkably reduced by the plasma treatment. In addition, variations in contact angle of water with the plasma-treated glass plate narrows to a range of 7 degrees ±3 degrees.

Even after the plasma treatment was continuously performed for about six months, the plasma treatment apparatus could stably provide uniform plasma without the occurrence of unusual discharge and a damage of the protection layer. In addition, there was no contamination of the plasma-treated object during the six months of the plasma treatment. When the distance (D) between the upper and lower electrodes 3, 4 of each electrode pair is 5 mm, similar results were obtained.

EXAMPLE 3

A plasma treatment apparatus 1 of the present invention of Example 3 is shown in FIG. 6. The apparatus 1 of FIG. 6 is substantially the same as that of FIG. 5 except for the following features. Details of electrodes 3, 4A and conditions of the plasma treatment of Example 3 are shown in Tables 1 and 2.

The apparatus 1 of Example 3 is characterized in that a single electrode pair, which is composed of one upper electrode 3 having a rectangular pipe structure and two lower electrodes 4A having a cylindrical structure, is arranged in the chamber 2. Each of the upper and lower electrodes 3, 4A is formed with an electrode substrate 10, which is a seamless pipe of a stainless steel (JIS: SUS304) produced by extrusion, and a protection layer 12 on an outer surface of the seamless pipe.

After a surface roughing treatment was performed to the outer surface of the seamless pipe by use of an air blast containing glass beads, the protection layer was formed on the seamless pipe by repeating a heat-fusion coating described below three times. That is, the heat-fusion coating comprises the steps of applying about 150 g of a glass-based material on the outer surface of the seamless pipe by use of a spray gun to obtain an applied film, drying the applied film at about 100° C. and heating the applied film at about 850° C. for 10 minutes. The glass-based material for the spray coating was prepared by the following steps.

A frit including alumina, silica and titania as main ingredients was prepared by melting and then rapid cooling these inorganic powders. A mixture was obtained by adding sodium aluminate and potassium carbonate to the frit in the presence of water as a solvent. After the mixture was milled for a required time period, it was allowed to pass a 200 mesh sieve (aperture size: 74 $\mu$m) to obtain a slurry as the glass-based material. As a result, the protection layer 12 having the thickness of about 0.5 mm and the withstand voltage of 20 kV was obtained on the electrode substrate 10. The composition of the protection layer 12 is shown in Table 1.

The upper and lower electrodes 3, 4A are arranged parallel with each other in the chamber 2 such that a distance (D) between the upper and lower electrodes is 5 mm. The apparatus 1 of Example 3 is of a batch-type structure not having the relaxation room and the conveying unit. The chamber 2 is made of an acrylic resin. The numeral 60 designates a sample stage disposed in the chamber 2.

By use of the apparatus 1 of FIG. 6, the following plasma treatment was performed. In Example 3, a silicon substrate having a 1-$\mu$m thickness film of a negative-type resist material was used as an object to be treated, and placed on the sample stage 60. A mixture gas of helium, argon and oxygen was supplied as the plasma-generation gas into the chamber 2 through a gas inlet 21. A flow amount of helium is 1 liter/min. A flow amount of oxygen is 60 cc/min. A flow amount of argon is 3 liter/min. Ion exchange water of the coolant maintained at about 20° C. was circulated through the respective electrodes during the plasma treatment.

The lower electrodes 4A are grounded, and the upper electrode 3 is connected to the power supply 6. 2 kV of AC voltage was applied between the upper and lower electrodes to generate the dielectric barrier discharge plasma of the mixture gas in a discharge space therebetween under atmospheric pressure. The applied electric power is 250 W. A frequency of the AC voltage is 100 kHz.

By performing the plasma treatment to the silicon substrate for about 20 seconds, the resist film was etched uniformly. In addition, no impurity other than the resist ingredients was substantially detected by XPS (X-ray photoelectron spectroscopy) analysis. Even after the plasma treatment was continuously performed for about six months, the plasma treatment apparatus could stably provide uniform plasma without the occurrence of unusual discharge and a damage of the protection layer.

EXAMPLE 4

A plasma treatment of the present invention of Example 4 was performed by use of the apparatus 1 of Example 3. In Example 4, an object to be treated was prepared by screen-printing a silver-palladium paste on a sintered alumina substrate, and baking a resultant product to obtain a circuit board having a bonding-pad portion thereon. A mixture gas of helium, argon and oxygen was supplied as the plasma-generation gas into the chamber 2. A flow amount of helium is 1 liter/min. A flow amount of hydrogen is 30 cc/min. A flow amount of argon is 3 liter/min. Conditions of the plasma treatment of Example 4 are shown in Table 3.

The plasma treatment was performed to the object for about 5 seconds. From results of the XPS analysis, a peak of silver oxide was detected from the object before the plasma treatment. However, after the plasma treatment, the peak of silver oxide disappeared, and a peak of metal silver was detected. This means reduction of silver oxide of the bonding-pad portion to metal silver. Even after the plasma treatment was continuously performed for about six months, the plasma treatment apparatus could stably provide uniform plasma without the occurrence of unusual discharge and a damage of the protection layer.

EXAMPLE 5

A plasma treatment apparatus 1 of Example 5 of the present invention is shown in FIG. 7. The apparatus 1 of FIG. 7 is substantially the same as that of FIG. 5 except for the following features. Details of electrodes 3, 4A and conditions of the plasma treatment are shown in Tables 1 and 3.

The plasma treatment apparatus of Example 5 is characterized in that a roller 80 of Teflon® for conveying an object 7 to be treated is disposed in a space between adjacent electrode pairs of three electrode pairs, each of which is composed of a single upper electrode 3 having a rectangular pipe structure and two lower electrodes 4A each having a cylindrical structure. The diameter and length of the roller 80 are 20 mm and 400 mm, respectively. Each of the rollers 80 can be rotated by a drive unit (not shown) disposed outside of the chamber 2.

That is, one end of the roller 80 is projected outside from a rear wall of the chamber 2 through an airtight seal member.

The projected ends of the rollers 80 are coupled to the drive unit by use of a power transfer belt (not shown). In addition, the apparatus 1 of this Example has no relaxation room. Therefore, the dimensions of the chamber 2 can be reduced by the proper locations of the rollers 80 in the chamber and the omission of the relaxation room. Incoming and outgoing gates 25A, 25B each having an air-pressure open/close mechanism are disposed adjacent to opposite side walls 26 of the chamber 2. Each of the side walls 26 has a slit 27 for feeding the object into the chamber 2.

By use of the apparatus 1 of FIG. 7, the following plasma treatment was performed. An object to be treated was prepared by placing three silicon substrates each having a 1-$\mu$m thickness film of a negative-type resist material on a glass plate having the dimensions of 300 mm×300 mm×2 mm. A mixture gas of helium, argon and oxygen was supplied as the plasma-generation gas into the chamber. A flow amount of helium is 1 liter/min. A flow amount of oxygen is 60 cc/min. A flow amount of argon is 3 liter/min. The chamber 2 is made of an acrylic resin and has the dimensions of 520 mm length×352 mm width×200 mm height.

All of the lower electrodes 4A are grounded, and all of the upper electrodes 3 are connected to the power supply 6. 2 kV of AC voltage was applied between the upper and lower electrodes to generate the dielectric barrier discharge plasma of the mixture gas in the discharge space therebetween under atmospheric pressure. The applied electric power is 250 W. A frequency of the AC voltage is 100 kHz. A conveying speed of the object is 2 mm/sec in the discharge space.

By performing the plasma treatment to the object for about 20 seconds, the resist films of the object were etched uniformly. In addition, results of the XPS analysis show that no impurity other than the resist ingredients is substantially detected.

EXAMPLE 6

A plasma treatment apparatus 1 of Example 6 of the present invention is shown in FIG. 8. The apparatus of FIG. 8 is substantially the same as that of FIG. 5 except for the following features. Therefore, no duplicate explanation is deemed necessary. Details of electrodes 3, 4A and conditions of the plasma treatment are shown in Tables 1 and 3.

In the apparatus 1, three electrode pairs, each of which is composed of a single upper electrode 3 having a rectangular pipe structure and two lower electrodes 4A having a cylindrical structure, are arranged according to the same manner as the apparatus of FIG. 5. A distance (D) between the upper and lower electrodes of each electrode pair is 5 mm. The chamber 2 is made of an acrylic resin and has the dimensions of 520 mm length×352 mm width×200 mm height.

Each of the lower electrodes 4A is rotatably supported about its axis in the chamber 2, and has a round bar 86 extending from its one end in an axial direction thereof. The round bar 86 is projected from a rear wall of the chamber through an airtight seal member, and coupled to a drive unit 50 through a rubber belt 52. When the lower electrodes 4A are rotated by the drive unit 50, an object 7 on the lower electrodes moves horizontally in the discharge space, as shown by the arrows in FIG. 8. Thus, each of the lower electrodes 4A also acts as a roller 80 for conveying the object 7.

By use of the apparatus 1 of FIG. 8, the following plasma treatment was performed. As an object 7 to be treated, a silicon wafer each having a 1-$\mu$m thickness film of a negative-type resist material was used. The diameter of the silicon wafer is 100 mm. A mixture gas of helium, argon and oxygen was supplied as the plasma-generation gas into the chamber 2 through a gas inlet 21. A flow amount of helium is 3 liter/min. A flow amount of oxygen is 80 cc/min. A flow amount of argon is 1 liter/min.

All of the lower electrodes 4A are grounded, and all of the upper electrodes 3 are connected to the power supply 6. 1.5 kV of AC voltage was applied between the upper and lower electrodes to generate the dielectric barrier discharge plasma of the mixture gas in a discharge space therebetween under atmospheric pressure. The applied electric power is 350 W. A frequency of the AC voltage is 13.56 MHz. The silicon wafer was conveyed at a speed of 3 mm/sec by rotation of the lower electrodes 4A acting as the rollers 80.

By performing the plasma treatment to the object for about 20 seconds, the resist film of the object was etched uniformly. In addition, results of XPS analysis show that no impurity other than the resist ingredients is substantially detected.

COMPARATIVE EXAMPLE 1

A plasma treatment apparatus of Comparative Example 1 is substantially the same as that of Example 1 except that each of upper and lower electrodes has a ceramic-sprayed layer produced by a conventional ceramic spraying method in place of the protection layer of Example 1. The ceramic-sprayed layer is an alumina-sprayed film having the thickness of about 0.5 mm.

By use of the apparatus of Comparative Example 1, a plasma treatment was performed under the same conditions as Example 1. In the plasma treatment, the occurrence of spark discharge was observed. It is presumed that the presence of pinholes in the ceramic-prayed film is a cause of the spark discharge. In addition, a serious damage of the ceramic-sprayed film occurred after the plasma treatment was continuously performed for about two months.

COMPARATIVE EXAMPLE 2

A plasma treatment apparatus of Comparative Example 2 is substantially the same as that of Example 2 except that each of upper and lower electrodes has a ceramic-sprayed layer produced by a conventional ceramic spraying method in place of the protection layer of Example 2. The protection layer is an alumina-sprayed film having the thickness of about 0.5 mm. By use of the apparatus of Comparative Example 2, a plasma treatment was performed under the same conditions as Example 2. In the plasma treatment, the occurrence of spark discharge was observed. In addition, the spark discharge gave a serious damage to the object.

As described above, the electrodes for plasma generation of the present invention exhibit the outstanding performance in the plasma treatments of Examples 1–6. The electrodes of the present invention can be also used in a plasma-treatment apparatus for removing foreign substances such as organic substances from objects to be treated, improving adhesion of organic films, surface modification, film formation, or reducing metal oxides. In particular, the plasma treatment apparatus with the electrodes of the present invention is suitable to efficiently treat objects with atmospheric pressure plasma of rare gas or a mixture of the rare gas and a reactive gas.

TABLE 1

|  |  | EXAMPLES | | |
|---|---|---|---|---|
|  |  | 1 | 2 | 3, 4, 5, 6 |
| Upper Electrode Substrate | Size (mm) | 32 × 16 × 911 | 32 × 16 × 911 | 32 × 16 × 400 |
|  | Material | Stainless Steel | Stainless Steel | Stainless Steel |
|  | Structure | Rectangular Pipe | Rectangular Pipe | Rectangular Pipe |
|  | Wall Thickness (mm) | 1.5 | 1.5 | 1.5 |
|  | Radius of Curvature at Corner (mm) | 1.5 | 1.5 | 1.5 |
|  | Production Method | RF Welding | Extrusion (Seamless) | Extrusion (Seamless) |
| Lower Electrode Substrate | Size (mm) | 32 × 16 × 911 | φ 14 × 911 | φ 14 × 400 |
|  | Material | Stainless Steel | Stainless Steel | Stainless Steel |
|  | Structure | Rectangular Pipe | Cylindrical Pipe | Cylindrical Pipe |
|  | Wall Thickness (mm) | 1.5 | 1.5 | 1.5 |
|  | Radius of Curvature at Corner (mm) | 1.5 | — | — |
|  | Production Method | RF Welding | Extrusion (Seamless) | Extrusion (Seamless) |
| Protection Layer | Main Ingredients | Silica = 48 wt % Titania = 27 wt % Alumina = 10 wt % | Silica = 53 wt % Titania = 30 wt % Alumina = 11 wt % | Silica = 48 wt % Titania = 27 wt % Alumina = 10 wt % |
|  | Thickness (mm) | 0.5 | 1 | 0.5 |
|  | Withstand Voltage (kV) | 20 | 50 | 20 |
|  | Content of Alkali/Alkali Earth metal (wt %) | Na = 8 wt % K = 7 wt % | Na = 3 wt % K = 2 wt % Mg = 1 wt % | Na = 8 wt % K = 7 wt % |
| Corrosion Resistance Layer |  | Formed | None | None |

TABLE 2

|  |  | EXAMPLES | | |
|---|---|---|---|---|
|  |  | 1 | 2 | 3 |
| Electrode Setting | Distance between Electrodes (D): mm | 3 | 3 | 5 |
|  | Pitch between Electrode Pairs (P): mm | 40 | 40 | — |
| Coolant | Material | Ion Exchange Water | Ion Exchange Water | Ion Exchange Water |
|  | Temperature (° C.) | 20 | 20 | 20 |
| Conveying Speed: mm/sec |  | 200 | 74 | — |
| Plasma-generation Gas | Flow Amount of He (liter/minute) | 8 | 8 | 1 |
|  | Flow Amount of Ar (liter/minute) | None | None | 3 |
|  | Flow Amount of $O_2$ (cc/minute) | None | 100 | 60 |
| Plasma-generation Condition | AC Voltage | 2 kV | 2 kV | 2 kV |
|  | Frequency of AC Voltage | 100 kHz | 100 kHz | 100 kHz |
|  | Applied Electric Power (W) | 1600 | 1600 | 250 |

TABLE 3

|  |  | EXAMPLES | | |
|---|---|---|---|---|
|  |  | 4 | 5 | 6 |
| Electrode Setting | Distance between Electrodes (D): mm | 5 | 5 | 5 |
|  | Pitch between Electrode Pairs (P): mm | — | 40 | 40 |
| Coolant | Material | Ion Exchange Water | Ion Exchange Water | Ion Exchange Water |
|  | Temperature (° C.) | 20 | 20 | 20 |
| Conveying Speed: mm/sec |  | — | 2 | 3 |
| Plasma-generation Gas | Flow Amount of He (liter/minute) | 1 | 1 | 3 |
|  | Flow Amount of Ar (liter/minute) | 3 | 3 | 1 |
|  | Flow Amount of $H_2$ (cc/minute) | 30 | — | — |
|  | Flow Amount of $O_2$ (cc/minute) | — | 60 | 80 |
| Plasma-generation Condition | AC Voltage | 2 kV | 2 kV | 1.5 kV |
|  | Frequency of AC Voltage | 100 kHz | 100 kHz | 13.56 MHz |
|  | Applied Electric Power (W) | 250 | 250 | 350 |

What is claimed is:

1. An electrode for generation of dielectric barrier discharge plasma comprising an electrode substrate and a protection layer formed by heat-fusion coating a glass-based material on at least an outer surface exposed to plasma of said electrode substrate,
wherein said protection layer contains 30 wt % or less of at least one of alkali and alkaline earth metals, and a thickness of said protection layer is within a range of 0.1 mm to 2 mm.

2. The electrode as set forth in claim 1, wherein said protection layer contains silica, alumina and titania as main ingredients.

3. The electrode as set forth in claim 1, wherein said electrode substrate is of a tubular structure, and said protection layer is formed on an outer surface of the tubular structure.

4. The electrode as set forth in claim 3, wherein said electrode substrate has a corrosion resistance layer on an inner surface of the tubular structure.

5. The electrode as set forth in claim 1, wherein said electrode substrate is a seamless pipe of an electrode material, and said protection layer is formed on an outer surface of said seamless pipe.

6. The electrode as set forth in claim 1, wherein a withstand voltage of said protection layer is within a range of 1 to 50 kV.

7. The electrode as set forth in claim 1, wherein said protection layer is formed by the heat-fusion coating comprising the steps of (a) applying a mixture of said glass-based material and a solvent on the surface of said electrode substrate to obtain an applied film, and (b) heating the applied film at a temperature of 400 to 1000° C.

8. The electrode as set forth in claim 7, wherein said protection layer is formed by repeating the steps (a) and (b) a given number of times.

9. The electrode as set forth in claim 1, wherein a surface roughing treatment is performed to the surface of said electrode substrate before the heat-fusion coating.

10. The electrode as set forth in claim 1, wherein said electrode substrate is of a tubular structure, which is formed by preparing a rectangular plate of an electrode material, and densely welding a side of the rectangular plate to an opposite side of the rectangular plate by means of voidless welding, while preventing the occurrence of voids at a welded portion.

11. The electrode as set forth in claim 1, wherein said protection layer contains 2 to 20 wt % or less of at least one of alkali and alkaline earth metals.

12. A plasma treatment apparatus for treating an object placed in a discharge space with a dielectric barrier discharge plasma under a pressure substantially equal to atmospheric pressure, said apparatus comprising:

at least one pair of electrodes for plasma generation;

a treatment chamber for accommodating said electrodes therein;

gas supply means for supplying a plasma-generation gas to said discharge space defined between said electrodes; and a power supply for applying a voltage between said electrodes to generate said dielectric barrier discharge plasma of the plasma-generation gas in said discharge space;

wherein a distance between said electrodes is within a range of 1 to 20 mm, and at least one of said electrodes has formed thereon a protection layer having a thickness within a range of 0.1 mm to 2 mm and comprising a glass-based material containing 30 wt % or less of at least one of alkali and alkaline earth metals.

13. The plasma treatment apparatus as set forth in claim 12, wherein said electrode is provided with said electrode substrate having a tubular structure, said protection layer on an outer surface of the tubular structure, and a corrosion resistance layer on an inner surface of the tubular structure.

14. The plasma treatment apparatus as set forth in claim 13, comprising an electrode cooling unit for providing a coolant in an interior of said electrode.

15. The plasma treatment apparatus as set forth in claim 12, wherein said at least one pair of electrodes are a plurality of pairs of upper and lower electrodes arranged to provide said discharge space, and said apparatus comprises a conveying unit for putting the object into said discharge space and removing a plasma-treated object from said discharge space, said conveying unit disposed at a space other than said discharge space in said chamber.

16. The plasma treatment apparatus as set forth in claim 12, wherein said at least one pair of electrodes are a plurality of pairs of upper and lower electrodes arranged to provide said discharge space, and said lower electrodes are used as a conveying unit for putting the object into said discharge space and removing a plasma-treated object from said discharge space.

17. The plasma treatment apparatus as set forth in claim 16, wherein each of said lower electrodes is of a cylindrical structure, which is rotatably supported in said chamber, and said apparatus comprises a drive unit for rotating said lower electrodes about their axes as rollers for conveying the object.

18. The plasma treatment apparatus as set forth in claim 12, wherein said chamber is made of a metal material, and said chamber has an insulation layer on an inner surface thereof.

19. A plasma treatment with the plasma treatment apparatus as set forth in claim 12, wherein the object is treated by said dielectric barrier discharge plasma of one of rare gas and a mixture of the rare gas and a reactive gas generated in the vicinity of atmospheric pressure.

* * * * *